(12) United States Patent
Liu et al.

(10) Patent No.: US 11,184,018 B1
(45) Date of Patent: Nov. 23, 2021

(54) MISMATCH AND TIMING CORRECTION TECHNIQUE FOR MIXING-MODE DIGITAL-TO-ANALOG CONVERTER (DAC)

(71) Applicant: QUALCOMM Incorporated, San Diego, CA (US)

(72) Inventors: Xilin Liu, San Diego, CA (US); Parisa Mahmoudidaryan, San Diego, CA (US); Shahin Mehdizad Taleie, San Diego, CA (US); Negar Rashidi, Mission Viejo, CA (US); Dongwon Seo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/087,234

(22) Filed: Nov. 2, 2020

(51) Int. Cl.
| | | |
|---|---|---|
| *H03M 1/18* | (2006.01) |
| *H03M 1/82* | (2006.01) |
| *H03M 1/06* | (2006.01) |
| *H03M 1/10* | (2006.01) |
| *H03K 5/156* | (2006.01) |
| *H03K 5/05* | (2006.01) |
| *H03M 1/80* | (2006.01) |
| *H03K 5/00* | (2006.01) |

(52) U.S. Cl.
CPC ............ *H03M 1/183* (2013.01); *H03K 5/05* (2013.01); *H03K 5/1565* (2013.01); *H03M 1/0626* (2013.01); *H03M 1/1009* (2013.01); *H03M 1/802* (2013.01); *H03M 1/825* (2013.01); *H03K 2005/00202* (2013.01)

(58) Field of Classification Search
CPC .... H03M 1/183; H03M 1/0626; H03M 1/802; H03M 1/1009; H03M 1/825; H03K 5/05; H03K 5/1565; H03K 2005/00202
USPC .......................................... 341/118, 126, 144
See application file for complete search history.

(56) References Cited

U.S. PATENT DOCUMENTS

| | | | |
|---|---|---|---|
| 10,056,891 B1* | 8/2018 | Stuenkel | H03K 5/1565 |
| 10,666,285 B1 | 5/2020 | Taleie et al. | |
| 10,784,880 B2* | 9/2020 | Wong | H03M 1/0626 |

* cited by examiner

*Primary Examiner* — Khai M Nguyen
(74) *Attorney, Agent, or Firm* — Patterson & Sheridan, LLP

(57) ABSTRACT

Certain aspects of the present disclosure generally relate to circuitry and techniques for digital-to-analog conversion. For example, certain aspects provide an apparatus for digital-to-analog conversion. The apparatus generally includes a mixing-mode digital-to-analog converter (DAC), a duty cycle adjustment circuit having an input coupled to an input clock node and having an output coupled to a clock input of the mixing-mode DAC, and a current comparison circuit having inputs coupled to outputs of the mixing-mode DAC and having an output coupled to a control input of the duty cycle adjustment circuit.

30 Claims, 5 Drawing Sheets

MISMATCH AND TIMING CORRECTION TECHNIQUE FOR MIXING-MODE DIGITAL-TO-ANALOG CONVERTER (DAC)

TECHNICAL FIELD

Certain aspects of the present disclosure generally relate to electronic circuits and, more particularly, to circuitry for digital-to-analog conversion.

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more digital-to-analog converters (DACs) for converting digital signals to analog signals.

SUMMARY

Certain aspects of the present disclosure generally relate to circuitry and techniques for digital-to-analog conversion.

Certain aspects provide an apparatus for digital-to-analog conversion. The apparatus generally includes a mixing-mode digital-to-analog converter (DAC), a duty cycle adjustment circuit having an input coupled to an input clock node and having an output coupled to a clock input of the mixing-mode DAC, and a current comparison circuit having inputs coupled to outputs of the mixing-mode DAC and having an output coupled to a control input of the duty cycle adjustment circuit.

Certain aspects provide a method for digital-to-analog conversion. The method may include providing, via a mixing-mode DAC, currents to outputs of the mixing-mode DAC based on a clock signal; comparing, via a current comparison circuit, the currents provided to the outputs of the mixing-mode DAC; and setting, via a duty cycle adjustment circuit, a duty cycle of the clock signal based on the comparison.

Certain aspects provide an apparatus for digital-to-analog conversion. The apparatus generally includes a mixing-mode DAC configured to provide currents to outputs of the mixing-mode DAC based on a clock signal, means for comparing the currents provided to the outputs of the mixing-mode DAC, and means for setting a duty cycle of the clock signal based on the comparison.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
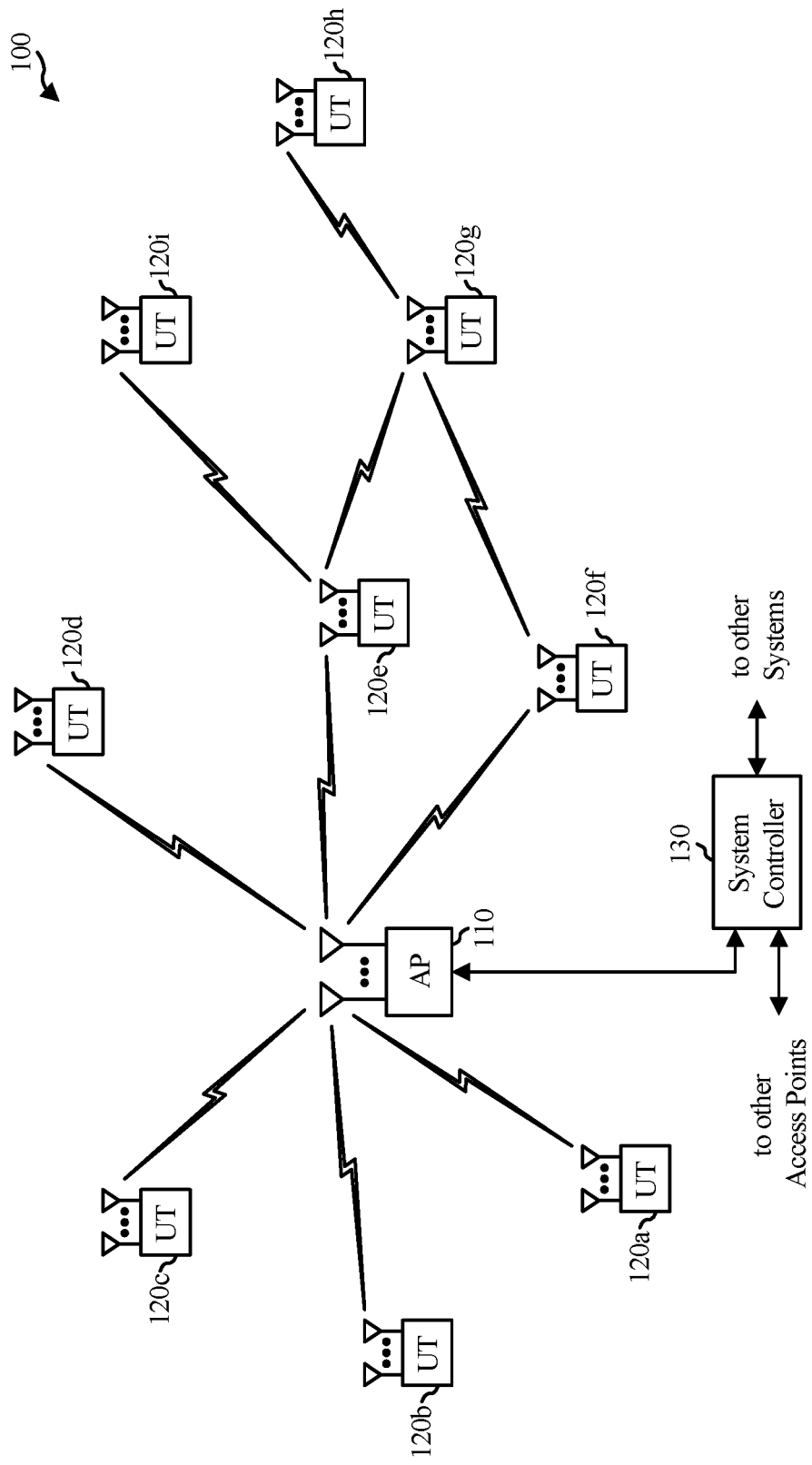
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include a digital-to-analog converter (DAC) system implemented using a mixing-mode DAC, as described in more detail herein.

Figure 2:
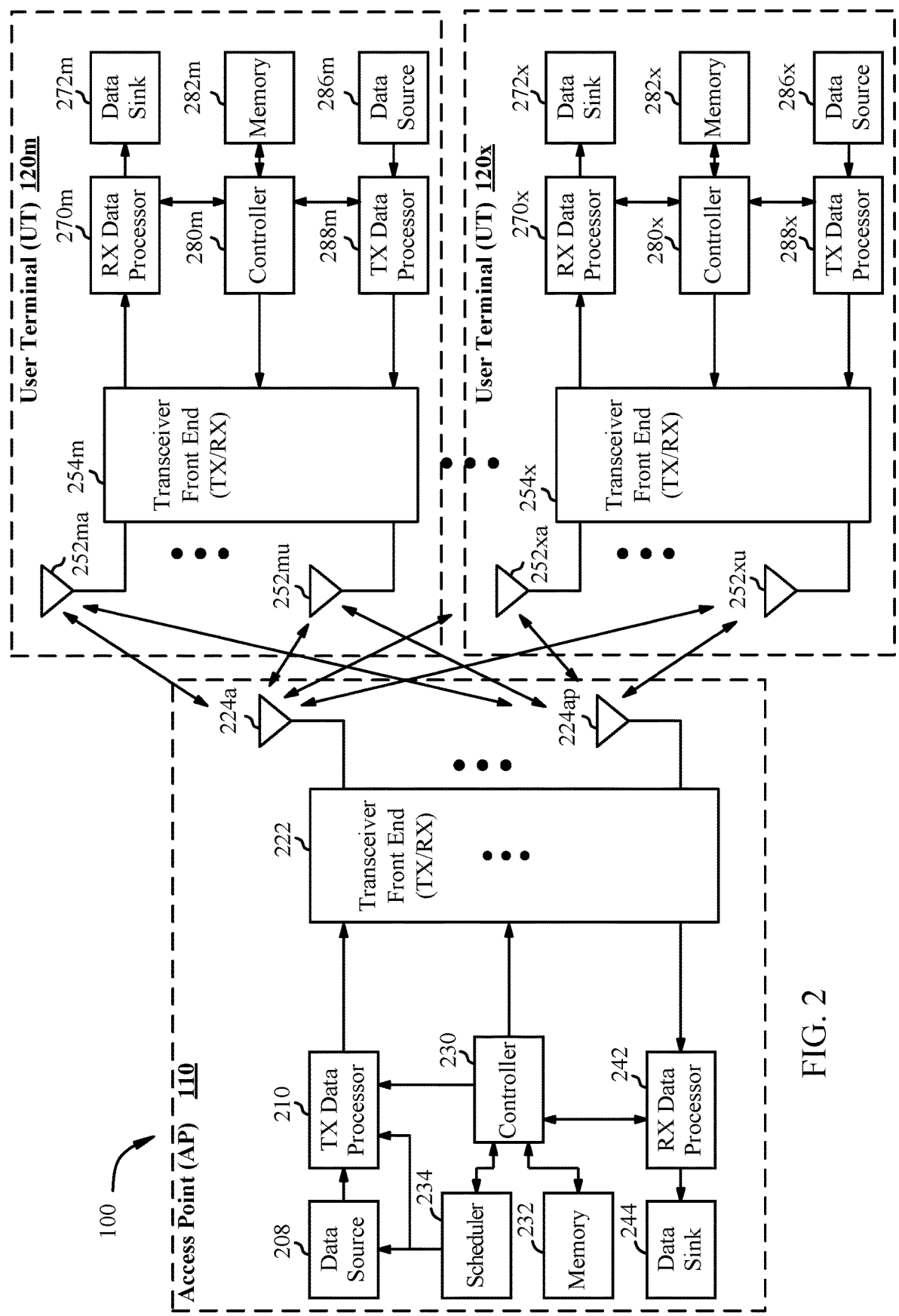
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio-frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. In certain aspects, the transceiver front end (TX/RX) 222 of access point 110 and/or transceiver front end 254 of user terminal 120 may include a DAC system implemented using a mixing-mode DAC, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

While FIGS. 1-2 provide a wireless communication system as an example application in which certain aspects of the present disclosure may be implemented to facilitate understanding, certain aspects described herein may be used for digital-to-analog conversion in any of various other suitable systems.

Example Mismatch and Timing Correction Technique for Mixing-Mode Digital-to-Analog Converter (DAC)

A mixing-mode digital-to-analog converter (DAC) (also known as an "up-converting DAC" or "a radio-frequency (RF) DAC") is an emerging DAC architecture that plays a more and more important role in high speed DAC design, especially for fifth-generation (5G) millimeter wave (mm-Wave) applications.

A conventional transmitter with a Cartesian modulator typically performs up-conversion on baseband signals using analog mixers. In an in-phase (I) channel for such a transmitter, an in-phase digital-to-analog converter (DAC) converts the in-phase digital baseband data signal into an analog in-phase waveform. A bandpass filter may filter the analog waveform to produce a filtered data stream that is up-converted by a mixer. The mixer mixes the filtered waveform with a local oscillator (LO) clock signal to produce a radio frequency (RF) signal.

A mixing-mode DAC is a DAC that not only converts a baseband signal into an analog signal but also up-converts the baseband signal into an RF analog signal. A mixing-mode DAC thus not only performs the function of the DAC in a conventional transmitter but also performs the function of the mixer.

A mixing-mode DAC is sensitive to mismatches and timing errors in the circuit path, including duty cycle errors from the phase-locked loop (PLL) used to generate clock signals for the mixing-mode DAC, mismatches in clock buffers and receivers, routing paths, switch drivers' rising and falling times, and current switches. In some implementations, even after careful design over process corners and temperature, the mismatches and timing errors of the mixing-mode DAC may result in a residual image (e.g., 30 dBc) and a phase mismatch (e.g., 15 degrees) at the output of the mixing-mode DAC.

Previous techniques used in an effort to reduce residual image and phase mismatch have focused on clock duty-cycle correction in an attempt to set a duty cycle for outputs of mixing-mode switch drivers to be as close to 50% as possible. However, even a perfect 50% duty cycle of the mixing-mode switch driver outputs may not guarantee a desired (e.g., balanced) current output for the mixing-mode DAC. Certain aspects of the present disclosure provide a closed loop system including a current comparison circuit configured for comparing currents output by the mixing-mode DAC, and adjusting a duty cycle of a clock signal for the mixing-mode DAC based on the comparison, as described in more detail herein.

Figure 3:
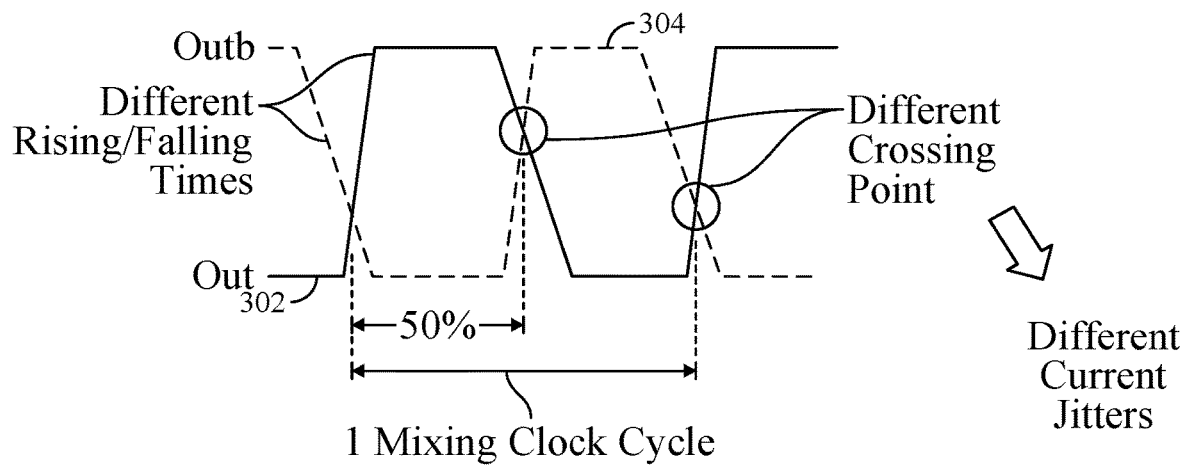
FIG. 3 illustrates an output signal and a complementary output signal of a mixing-mode switch driver, in accordance with certain aspects of the present disclosure.

FIG. 3 illustrates an output (out) signal 302 and a complementary output (outb) signal 304 of a mixing-mode switch driver, in accordance with certain aspects of the present disclosure. As illustrated, the rising and falling times of the out signal 302 and the outb signal 304 may be different, resulting in different crossing points of the out and outb signals at each half clock-cycle. Therefore, although the duty cycle of the out and outb signals may be 50%, the mixing current output of the mixing-mode DAC may experience current jitter that varies due to the rising and falling edges of the out and outb signals.

Figure 4:
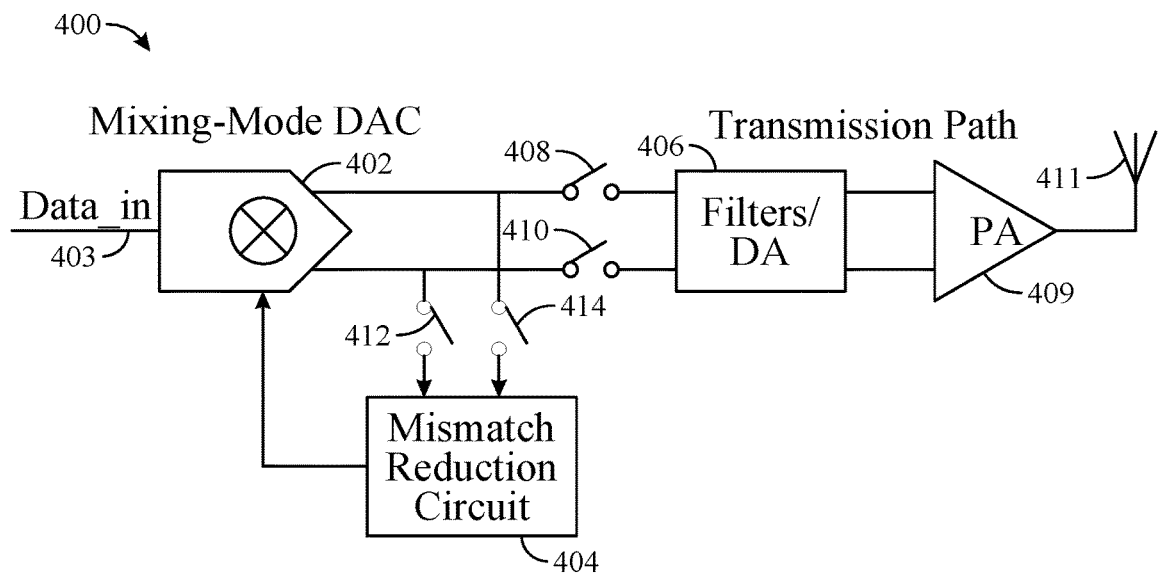
FIG. 4 illustrates a radio-frequency (RF) front end implemented using a mixing-mode digital-to-analog converter (DAC) and a mismatch reduction circuit, in accordance with certain aspects of the present disclosure.

FIG. 4 illustrates an RF front end 400 of a wireless communication device implemented using a mixing-mode DAC 402 and a mismatch reduction circuit 404, in accordance with certain aspects of the present disclosure. The mixing-mode DAC 402 may receive a digital data input signal (data_in) at a data input node 403 from a baseband processor (e.g., TX data processor 210 or 288 of FIG. 2) and generate an analog signal at an RF frequency based on data_in. As illustrated, the outputs of the mixing-mode DAC 402 may be selectively coupled to a filter 406 (and a drive amplifier (DA)). For example, switches 408, 410 may be coupled between the mixing-mode DAC 402 and the filter 406. The switches 408, 410 may be closed during a mission mode of operation (e.g., during signal transmission). The output of the filter 406 may be coupled to a power amplifier (PA) 409 for amplification of the filtered signals for transmission via antenna 411.

In certain aspects, the RF front end 400 may include a mismatch reduction circuit 404 selectively coupled to the outputs of the mixing-mode DAC 402 via switches 412, 414. The mismatch reduction circuit 404 may convert mixing-mode current outputs of the mixing-mode DAC 402 to a direct-current (DC) error signal for measurement and correction. For example, during a calibration mode of operations, the switches 408, 410 may be opened, and the switches 412, 414 may be closed. The input of the mixing-mode DAC 402 may be set to a maximum (or minimum) digital input code. With the maximum (or minimum) digital input code, the currents provided to the outputs of the mixing-mode DAC 402 should be balanced. Thus, based on the output currents of the mixing-mode DAC 402, the mismatch reduction circuit 404 may detect whether a phase mismatch (e.g., an imbalance) exists between the mixing-mode currents and adjust the duty cycle of a clock signal for the mixing-mode DAC 402 until the currents provided at the differential outputs of the mixing-mode DAC 402 are balanced (e.g., have close to zero phase mismatch).

Figure 5:
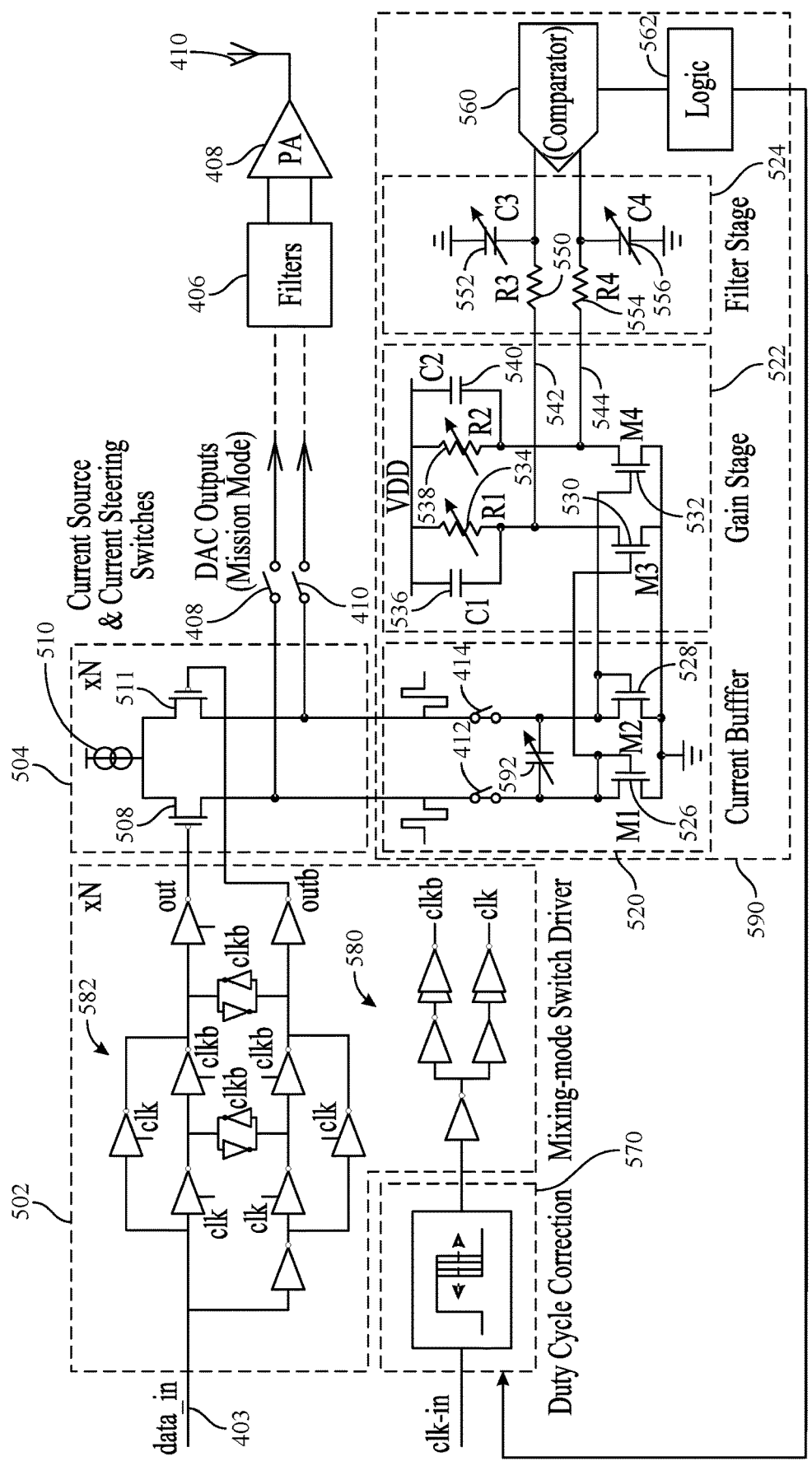
FIG. 5 illustrates example implementations of a mixing-mode DAC and a mismatch reduction circuit, in accordance with certain aspects of the present disclosure.

FIG. 5 illustrates example implementations of a mixing-mode DAC and a mismatch reduction circuit, in accordance with certain aspects of the present disclosure. For example, a mixing-mode DAC (e.g. mixing-mode DAC 402 as illustrated in FIG. 4) may include N mixing-mode switch drivers 502, N being an integer equal to the total number of bits of data_in. Each of the mixing-mode switch drivers 502 generates an output signal (e.g., corresponding to out signal 302) and a complementary output signal (e.g., corresponding to outb signal 304). The N mixing-mode switch drivers 502 are coupled to N current-steering cells 504 of the mixing-mode DAC. Each of the current-steering cells may include a current source (e.g., current source 510), and current-steering switches (e.g., current-steering switches 508, 511). As illustrated, each of the current-steering switches may be implemented using a p-type metal-oxide-semiconductor (PMOS) transistor.

The out signal and the outb signal of each of the mixing-mode switch drivers 502 may be used to drive the current-steering switches of a respective one of the current-steering cells 504. For example, an out signal may be used to drive a gate of the PMOS transistor used to implement the current-steering switch 508, and an outb signal may be used to drive a gate of the PMOS transistor used to implement the current-steering switch 511, as illustrated.

During the calibration mode of operation, the switches 408, 410 are open and the switches 412, 414 are closed. Thus, the current from each current source (e.g., current source 510) of the current-steering cells are directed, via the current-steering switches, to one of the outputs of the mixing-mode DAC based on the out and outb signals. For example, the currents from the current-steering cells may flow to a current comparison circuit 590. The current comparison circuit 590 may compare the currents provided to the outputs of the mixing-mode DAC, and control a duty cycle adjustment circuit 570 accordingly. For instance, the duty cycle adjustment circuit 570 may receive an input clock signal (clk_in) and apply a duty cycle adjustment (e.g., via delay elements) to generate an adjusted clock signal to be input to the mixing-mode switch drivers. As illustrated, based on the adjusted clock signal, each of the mixing-mode switch drivers 502 may generate clock (clk) and complementary clock (clkb) signals via inverters 580. Each of the mixing-mode switch drivers 502 also generates, via inverters 582, the out and outb signals based on the clk and clkb signals, as illustrated. The current comparison circuit 590 and the duty cycle adjustment circuit 570 (also referred to as a "duty cycle correction circuit") may be part of the mismatch reduction circuit 404 described with respect to FIG. 4.

As illustrated, the current comparison circuit 590 may include a current buffer 520 which may be coupled to a gain stage 522. The current buffer 520 may include a transistor 526 and a transistor 528. The transistor 526 may form a current mirror with a transistor 530 of the gain stage 522, and the transistor 528 may form a current mirror with transistor 532 of the gain stage 522. In other words, the transistor 526 may form a first branch of a first current mirror, and the transistor 530 may form a second branch of the first current mirror. Moreover, the transistor 528 may form a first branch of a second current mirror, and the transistor 532 may form a second branch of the second current mirror. As illustrated, a capacitive element 592 (e.g., having a variable capacitance) may be coupled between the first branches of the first current mirror. For example, the capacitive element 592 may be coupled between drains of the transistors 526, 528.

In certain aspects, the gain stage 522 may include a resistive element 534 in parallel with a capacitive element 536, and a resistive element 538 in parallel with a capacitive element 540. The resistive element 534 and the capacitive element 536 may be coupled between a voltage rail (VDD) and the transistor 530, and the resistive element 538 and the capacitive element 540 may be coupled between VDD and the transistor 532, in effect generating voltages at nodes 542, 544 based on the currents from the current-steering cells.

As illustrated, the gain stage 522 may be coupled to a filter stage 524. The filter stage 524 includes a resistive element 550 coupled to a capacitive element 552, and a resistive element 554 coupled to a capacitive element 556, as illustrated. The capacitive element 552 may be coupled between a reference potential node (e.g., electric ground) and a first input of an analog-to-digital converter (ADC) 560, and the capacitive element 556 may be coupled between the reference potential node and a second input of the ADC. For certain aspects, the ADC 560 may be implemented using a comparator (e.g., a 1-bit ADC). The resistive element 550 and the capacitive element 552 form a low-pass filter for node 542 to provide a filtered version of the voltage at node 542 to the first input of ADC 560. The resistive element 554 and the capacitive element 556 form another low-pass filter for node 544 to provide a filtered version of the voltage at node 544 to the second input of the ADC 560. Any or any combination of the resistive elements 550, 554 and the capacitive elements 552, 556 may be tunable. The ADC 560 converts (or the comparator compares) the voltages at the first and second inputs of the ADC 560 and provides an indication of the conversion (comparison) results to logic 562. The logic 562 controls the duty cycle adjustment circuit 570. For example, if the voltage at node 542 is greater than the voltage at node 544, the logic 562 may output control signals to adjust the duty cycle of the clock signal input to the mixing-mode switch drivers in an attempt to reduce the voltage at node 542, in effect reducing the phase mismatch associated with the mixing-mode DAC outputs.

In certain aspects, the gain stage may be programmable. For example, the resistive elements 534, 538 may be variable resistive elements. The resistance of the resistive elements 534, 538 may be set based on the operating frequency of the mixing-mode DAC. Similarly, the filter stage may be programmable in some aspects, as explained above. For example, the capacitive elements 552, 556 may be variable capacitive elements as illustrated, the capacitances of the capacitive elements 552, 556 being set based on the operating frequency of the mixing-mode DAC. The aspects described herein allow for implementation of a mixing-mode DAC with reduced power and area consumption as compared to conventional implementations of mixing-mode DACs that may use an interleaving architecture.

Figure 6:
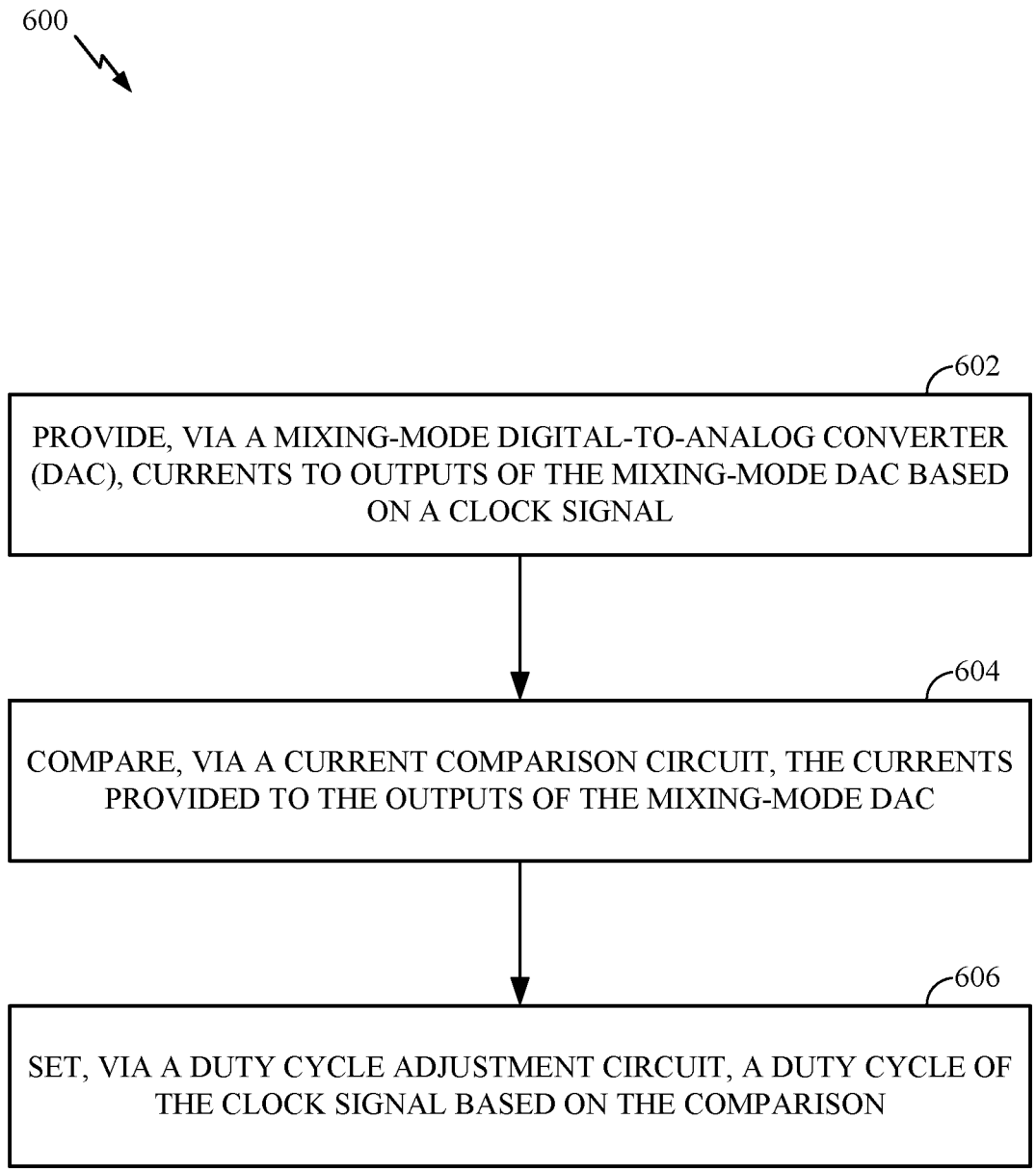
FIG. 6 is a flow diagram illustrating example operations for digital-to-analog conversion, in accordance with certain aspects of the present disclosure.

FIG. 6 is a flow diagram illustrating example operations 600 for digital-to-analog conversion, in accordance with certain aspects of the present disclosure. The operations 600 may be performed, for example, by a DAC system such as the mixing-mode DAC 402 and the mismatch reduction circuit 404.

The operations 600 begin, at block 602, with the DAC system providing, via a mixing-mode DAC (e.g., mixing-mode DAC 402), currents to outputs of the mixing-mode DAC based on a clock signal. At block 604, the DAC system compares, via a current comparison circuit (e.g., current comparison circuit 590), the currents provided to the outputs of the mixing-mode DAC, and at block 606, sets, via a duty cycle adjustment circuit (e.g., duty cycle adjustment circuit 570), a duty cycle of the clock signal based on the comparison. For example, the current comparison circuit may perform integration and filtering functions based on the currents from the mixing-mode DAC to generate a direct-current (DC) signal, and the duty cycle adjustment circuit may set a duty cycle of the clock signal for the mixing-mode DAC based on the DC signal.

In certain aspects, the DAC system may couple, via a first switch (e.g., switch 412), an input of the current comparison circuit to one of the outputs of the mixing-mode DAC during a calibration phase, the duty cycle of the clock signal being set during the calibration phase. The DAC system may also couple, via a second switch (e.g., switch 414), another input of the current comparison circuit to another one of the outputs of the mixing-mode DAC during the calibration phase.

In certain aspects, comparing the current may include generating, via a gain stage (e.g., gain stage 522), voltages based on the currents provided to the outputs of the mixing-mode DAC, and converting, via an ADC (e.g., ADC 560, which may be a comparator), the voltages generated via the gain stage to a digital signal, where the duty cycle of the clock signal is generated based on the digital signal. In some aspects, the DAC system may filter, via a filter stage (e.g., filter stage 524), the voltages generated via the gain stage, where the conversion of the voltages comprises converting the filtered voltages.

In some aspects, the DAC system may mirror, via a current buffer (e.g., current buffer 520), the currents provided to the outputs of the mixing-mode DAC, where the voltages are generated based on the mirrored currents. In some aspects, the current buffer may include a first branch (e.g., including transistor 526) of a first current mirror and a first branch (e.g., including transistor 528) of a second current mirror. The gain stage may include a second branch (e.g., including transistor 530) of the first current mirror and a second branch (e.g. including transistor 532) of the second current mirror. In some aspects, a capacitive element (e.g., capacitive element 592) may be coupled between the first branch of the first current mirror and the first branch of the second current mirror. In some aspects, the second branch of the first current mirror may be coupled to a first input of the ADC, and the second branch of the second current mirror may be coupled to a second input of the ADC. In certain aspects, the gain stage may include a first impedance coupled between a voltage rail (e.g., VDD) and a first output (e.g., at node 542) of the gain stage, and a second impedance coupled between the voltage rail and a second output (e.g., at node 544) of the gain stage. Each of the first impedance and the second impedance may include a resistive element (e.g. resistive element 534, 538) coupled in parallel with a capacitive element (e.g., capacitive element 536, 540).

In some aspects, providing the currents to the outputs of the mixing-mode DAC may include generating, via each of a plurality of mixing-mode switch drivers (e.g., mixing-mode switch drivers 502), switch control signals based on the clock signal and a data input signal (e.g., data_in), and directing a current (e.g., a current generated by current source 510), via each of a plurality of current-steering cells (e.g., current-steering cells 504), to one of the outputs of the mixing-mode DAC based on the switch control signals. In some aspects, the DAC system may couple the outputs of the mixing-mode DAC to a filter (e.g., filter 406) during a mission mode of operation.

The mismatch reduction circuit described herein provides for integration of mixing-frequency currents (e.g., currents from current-steering cells 504) from the mixing-mode DAC 402 to DC. The integration function is performed using the input capacitive element (e.g., capacitive element 592) and the following filtering stages (e.g., filter stage 524).

Example Aspects

Aspect 1. An apparatus for digital-to-analog conversion, comprising: a mixing-mode digital-to-analog converter (DAC); a duty cycle adjustment circuit having an input coupled to an input clock node and having an output coupled to a clock input of the mixing-mode DAC; and a current comparison circuit having inputs coupled to outputs of the mixing-mode DAC and having an output coupled to a control input of the duty cycle adjustment circuit.

Aspect 2. The apparatus of aspect 1, wherein the current comparison circuit is configured to perform integration and filtering functions based on currents from the mixing-mode DAC to generate a direct-current (DC) signal, the duty cycle adjustment circuit being configured to set a duty cycle of a clock signal for the mixing-mode DAC based on the DC signal.

Aspect 3. The apparatus of one of aspects 1-2, further comprising: a first switch coupled between one of the inputs of the current comparison circuit and one of the outputs of the mixing-mode DAC; and a second switch coupled between another one of the inputs of the current comparison circuit and another one of the outputs of the mixing-mode DAC.

Aspect 4. The apparatus of one of aspects 1-3, wherein the current comparison circuit comprises: a gain stage coupled to the outputs of the mixing-mode DAC; and an analog-to-digital converter (ADC) having inputs coupled to outputs of the gain stage, the output of the ADC being coupled to the control input of the duty cycle adjustment circuit.

Aspect 5. The apparatus of aspect 4, wherein the ADC comprises a comparator.

Aspect 6. The apparatus of one of aspects 4-5, wherein the current comparison circuit further comprises logic coupled between the output of the ADC and the control input of the duty cycle adjustment circuit.

Aspect 7. The apparatus of one of aspects 4-6, wherein the current comparison circuit further comprises a filter stage coupled between the outputs of the gain stage and the inputs of the ADC.

Aspect 8. The apparatus of aspect 7, wherein the filter stage comprises: a first resistive element coupled between one of the outputs of the gain stage and an input of the ADC; a second resistive element coupled between another one of the outputs of the gain stage and another input of the ADC; a first capacitive element coupled between the input of the ADC and a reference potential node; and a second capacitive element coupled between the other input of the ADC and the reference potential node.

Aspect 9. The apparatus of one of aspects 4-8, wherein the current comparison circuit further comprises a current buffer coupled between the gain stage and the outputs of the mixing-mode DAC.

Aspect 10. The apparatus of aspect 9, wherein the current buffer comprises a first branch of a first current mirror and a first branch of a second current mirror, and wherein the gain stage comprises a second branch of the first current mirror and a second branch of the second current mirror.

Aspect 11. The apparatus of aspect 10, further comprising a capacitive element coupled between the first branch of the first current mirror and the first branch of the second current mirror.

Aspect 12. The apparatus of one of aspects 10-11, wherein the second branch of the first current mirror is coupled to a first input of the ADC, and wherein the second branch of the second current mirror is coupled to a second input of the ADC.

Aspect 13. The apparatus of one of aspects 10-12, wherein the gain stage further comprises: a first impedance coupled between a voltage rail and a first output of the gain stage, and a second impedance coupled between the voltage rail and a second output of the gain stage.

Aspect 14. The apparatus of aspect 13, wherein each of the first impedance and the second impedance comprises a resistive element coupled in parallel with a capacitive element.

Aspect 15. The apparatus of one of aspects 1-14, wherein the mixing-mode DAC comprises: mixing-mode switch drivers, each having a data input coupled to a data input node, wherein clock inputs of the mixing-mode switch drivers are coupled to the input clock node; and current-steering cells, each having current-steering switches, wherein control inputs of the current-steering switches are coupled to outputs of a respective one of the mixing-mode switch drivers.

Aspect 16. A wireless communication device comprising the apparatus of claim 1, the wireless communication device further comprising: a filter selectively coupled to the outputs of the mixing-mode DAC; and an amplifier coupled to outputs of the filter.

Aspect 17. A method for digital-to-analog conversion, comprising: providing, via a mixing-mode digital-to-analog converter (DAC), currents to outputs of the mixing-mode DAC based on a clock signal; comparing, via a current comparison circuit, the currents provided to the outputs of the mixing-mode DAC; and setting, via a duty cycle adjustment circuit, a duty cycle of the clock signal based on the comparison.

Aspect 18. The method of aspect 17, further comprising: coupling, via a first switch, an input of the current comparison circuit to one of the outputs of the mixing-mode DAC during a calibration phase, the duty cycle of the clock signal being set during the calibration phase; and coupling, via a second switch, another input of the current comparison circuit to another one of the outputs of the mixing-mode DAC during the calibration phase.

Aspect 19. The method of one of aspects 17-18, wherein comparing the current comprises: generating, via a gain stage, voltages based on the currents provided to the outputs of the mixing-mode DAC; and converting, via an analog-to-digital converter (ADC), the voltages generated via the gain stage to a digital signal, wherein the duty cycle of the clock signal is generated based on the digital signal.

Aspect 20. The method of aspect 19, further comprising filtering, via a filter stage, the voltages generated via the gain stage, wherein the conversion of the voltages comprises converting the filtered voltages.

Aspect 21. The method of one of aspects 19-20, further comprising mirroring, via a current buffer, the currents provided to the outputs of the mixing-mode DAC, wherein the voltages are generated based on the mirrored currents.

Aspect 22. The method of aspect 21, wherein the current buffer comprises a first branch of a first current mirror and a first branch of a second current mirror, and wherein the gain stage comprises a second branch of the first current mirror and a second branch of the second current mirror.

Aspect 23. The method of aspect 22, wherein a capacitive element is coupled between the first branch of the first current mirror and the first branch of the second current mirror.

Aspect 24. The method of one of aspects 22-23, wherein the second branch of the first current mirror is coupled to a first input of the ADC, and wherein the second branch of the second current mirror is coupled to a second input of the ADC.

Aspect 25. The method of one of aspects 22-24, wherein the gain stage further comprises: a first impedance coupled between a voltage rail and a first output of the gain stage; and a second impedance coupled between the voltage rail and a second output of the gain stage.

Aspect 26. The method of aspect 25, wherein each of the first impedance and the second impedance comprises a resistive element coupled in parallel with a capacitive element.

Aspect 27. The method of one of aspects 17-26, wherein providing the currents to the outputs of the mixing-mode DAC comprises: generating, via each of a plurality of mixing-mode switch drivers, switch control signals based on the clock signal and a data input signal; and directing a current, via each of a plurality of current-steering cells, to one of the outputs of the mixing-mode DAC based on the switch control signals.

Aspect 28. The method of one of aspects 17-27, further comprising coupling the outputs of the mixing-mode DAC to a filter during a mission mode of operation.

Aspect 29. An apparatus for digital-to-analog conversion, comprising: a mixing-mode digital-to-analog converter (DAC) configured to provide currents to outputs of the mixing-mode DAC based on a clock signal; means for comparing the currents provided to the outputs of the mixing-mode DAC; and means for setting a duty cycle of the clock signal based on the comparison.

Aspect 30. The apparatus of claim 29, wherein the means for comparing the currents comprises: means for generating voltages based on the currents provided to the outputs of the mixing-mode DAC; and means for converting the voltages to a digital signal, wherein the means for setting is configured to set the duty cycle of the clock signal based on the digital signal.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering. In certain aspects, means for comparing may include a current comparison circuit, such as the current comparison circuit 590. Means for setting may include a duty cycle adjustment circuit, such as the duty cycle adjustment circuit 570. Means for generating may include a gain stage, such as the gain stage 522. Means for converting may include an ADC (including a comparator, which is a 1-bit ADC), such as the ADC 560.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. An apparatus for digital-to-analog conversion, comprising:
a mixing-mode digital-to-analog converter (DAC);
a duty cycle adjustment circuit having an input coupled to an input clock node and having an output coupled to a clock input of the mixing-mode DAC; and
a current comparison circuit having inputs coupled to outputs of the mixing-mode DAC and having an output coupled to a control input of the duty cycle adjustment circuit.

2. The apparatus of claim 1, wherein the current comparison circuit is configured to perform integration and filtering functions based on currents from the mixing-mode DAC to generate a direct-current (DC) signal, the duty cycle adjustment circuit being configured to set a duty cycle of a clock signal for the mixing-mode DAC based on the DC signal.

3. The apparatus of claim 1, further comprising:
a first switch coupled between one of the inputs of the current comparison circuit and one of the outputs of the mixing-mode DAC; and
a second switch coupled between another one of the inputs of the current comparison circuit and another one of the outputs of the mixing-mode DAC.

4. The apparatus of claim 1, wherein the current comparison circuit comprises:
a gain stage coupled to the outputs of the mixing-mode DAC; and
an analog-to-digital converter (ADC) having inputs coupled to outputs of the gain stage, the output of the ADC being coupled to the control input of the duty cycle adjustment circuit.

5. The apparatus of claim 4, wherein the ADC comprises a comparator.

6. The apparatus of claim 4, wherein the current comparison circuit further comprises logic coupled between the output of the ADC and the control input of the duty cycle adjustment circuit.

7. The apparatus of claim 4, wherein the current comparison circuit further comprises a filter stage coupled between the outputs of the gain stage and the inputs of the ADC.

8. The apparatus of claim 7, wherein the filter stage comprises:
a first resistive element coupled between one of the outputs of the gain stage and an input of the ADC;
a second resistive element coupled between another one of the outputs of the gain stage and another input of the ADC;
a first capacitive element coupled between the input of the ADC and a reference potential node; and
a second capacitive element coupled between the other input of the ADC and the reference potential node.

9. The apparatus of claim 4, wherein the current comparison circuit further comprises a current buffer coupled between the gain stage and the outputs of the mixing-mode DAC.

10. The apparatus of claim 9, wherein the current buffer comprises a first branch of a first current mirror and a first branch of a second current mirror, and wherein the gain stage comprises a second branch of the first current mirror and a second branch of the second current mirror.

11. The apparatus of claim 10, further comprising a capacitive element coupled between the first branch of the first current mirror and the first branch of the second current mirror.

12. The apparatus of claim 10, wherein the second branch of the first current mirror is coupled to a first input of the ADC, and wherein the second branch of the second current mirror is coupled to a second input of the ADC.

13. The apparatus of claim 10, wherein the gain stage further comprises:
a first impedance coupled between a voltage rail and a first output of the gain stage, and
a second impedance coupled between the voltage rail and a second output of the gain stage.

14. The apparatus of claim 13, wherein each of the first impedance and the second impedance comprises a resistive element coupled in parallel with a capacitive element.

15. The apparatus of claim 1, wherein the mixing-mode DAC comprises:
mixing-mode switch drivers, each having a data input coupled to a data input node, wherein clock inputs of the mixing-mode switch drivers are coupled to the input clock node; and
current-steering cells, each having current-steering switches, wherein control inputs of the current-steering switches are coupled to outputs of a respective one of the mixing-mode switch drivers.

16. A wireless communication device comprising the apparatus of claim 1, the wireless communication device further comprising:
a filter selectively coupled to the outputs of the mixing-mode DAC; and
an amplifier coupled to outputs of the filter.

17. A method for digital-to-analog conversion, comprising:
providing, via a mixing-mode digital-to-analog converter (DAC), currents to outputs of the mixing-mode DAC based on a clock signal;
comparing, via a current comparison circuit, the currents provided to the outputs of the mixing-mode DAC; and
setting, via a duty cycle adjustment circuit, a duty cycle of the clock signal based on the comparison.

18. The method of claim 17, further comprising:
coupling, via a first switch, an input of the current comparison circuit to one of the outputs of the mixing-mode DAC during a calibration phase, the duty cycle of the clock signal being set during the calibration phase; and
coupling, via a second switch, another input of the current comparison circuit to another one of the outputs of the mixing-mode DAC during the calibration phase.

19. The method of claim 17, wherein comparing the current comprises:
generating, via a gain stage, voltages based on the currents provided to the outputs of the mixing-mode DAC; and
converting, via an analog-to-digital converter (ADC), the voltages generated via the gain stage to a digital signal, wherein the duty cycle of the clock signal is generated based on the digital signal.

20. The method of claim 19, further comprising filtering, via a filter stage, the voltages generated via the gain stage, wherein the conversion of the voltages comprises converting the filtered voltages.

21. The method of claim 19, further comprising mirroring, via a current buffer, the currents provided to the outputs of the mixing-mode DAC, wherein the voltages are generated based on the mirrored currents.

22. The method of claim 21, wherein the current buffer comprises a first branch of a first current mirror and a first branch of a second current mirror, and wherein the gain stage comprises a second branch of the first current mirror and a second branch of the second current mirror.

23. The method of claim 22, wherein a capacitive element is coupled between the first branch of the first current mirror and the first branch of the second current mirror.

24. The method of claim 22, wherein the second branch of the first current mirror is coupled to a first input of the ADC, and wherein the second branch of the second current mirror is coupled to a second input of the ADC.

25. The method of claim 22, wherein the gain stage further comprises:
 a first impedance coupled between a voltage rail and a first output of the gain stage; and
 a second impedance coupled between the voltage rail and a second output of the gain stage.

26. The method of claim 25, wherein each of the first impedance and the second impedance comprises a resistive element coupled in parallel with a capacitive element.

27. The method of claim 17, wherein providing the currents to the outputs of the mixing-mode DAC comprises:
 generating, via each of a plurality of mixing-mode switch drivers, switch control signals based on the clock signal and a data input signal; and
 directing a current, via each of a plurality of current-steering cells, to one of the outputs of the mixing-mode DAC based on the switch control signals.

28. The method of claim 17, further comprising coupling the outputs of the mixing-mode DAC to a filter during a mission mode of operation.

29. An apparatus for digital-to-analog conversion, comprising:
 a mixing-mode digital-to-analog converter (DAC) configured to provide currents to outputs of the mixing-mode DAC based on a clock signal;
 means for comparing the currents provided to the outputs of the mixing-mode DAC; and
 means for setting a duty cycle of the clock signal based on the comparison.

30. The apparatus of claim 29, wherein the means for comparing the currents comprises:
 means for generating voltages based on the currents provided to the outputs of the mixing-mode DAC; and
 means for converting the voltages to a digital signal, wherein the means for setting is configured to set the duty cycle of the clock signal based on the digital signal.

* * * * *